United States Patent [19]

Silverberg et al.

[11] Patent Number: 5,726,574
[45] Date of Patent: Mar. 10, 1998

[54] METHOD OF LOCATING A FAULT IN AN ELECTRIC POWER CABLE

[75] Inventors: Michael H. Silverberg, Livingston; Jack F. Trezza, Hopatcong, both of N.J.

[73] Assignee: Electric Power Research Institute, Inc., Palo Alto, Calif.

[21] Appl. No.: 613,932

[22] Filed: Mar. 11, 1996

[51] Int. Cl.⁶ .......................... G01R 31/08; G01R 19/14
[52] U.S. Cl. .......................... 324/529; 324/536; 324/133
[58] Field of Search .......................... 324/522, 520, 324/521, 529, 536, 535, 525, 133

[56] References Cited

U.S. PATENT DOCUMENTS

| | | | |
|---|---|---|---|
| 2,717,992 | 9/1957 | Weintraub | 324/535 |
| 3,462,681 | 8/1969 | Biskup | 324/535 |
| 3,609,533 | 9/1971 | Pardis | 324/535 |
| 3,986,116 | 10/1976 | Smith | 324/133 |
| 4,063,160 | 12/1977 | Lanz | 324/522 |
| 4,352,137 | 9/1982 | Johns | 324/519 |
| 4,559,491 | 12/1985 | Saha | 324/522 |
| 4,731,689 | 3/1988 | Nimmersjo | 324/522 |
| 4,800,509 | 1/1989 | Nimmersjo | 324/509 |
| 5,399,974 | 3/1995 | Eriksson | 324/522 |
| 5,416,418 | 5/1995 | Maureira | 324/536 |
| 5,455,776 | 10/1995 | Novosel | 324/521 |

*Primary Examiner*—Kenneth A. Wieder
*Assistant Examiner*—Jose M. Solis
*Attorney, Agent, or Firm*—Flehr Hohbach Test Albritton & Herbert. LLP

[57] ABSTRACT

A method of pinpointing the location between manholes of a fault in an electrical cable typically buried underground in an urban environment, the fault being caused by an insulation defect which may be broken down by a high voltage includes the steps of applying the voltage to break down the fault insulation defect to induce a transient fault pulse on the cable on both sides of the fault traveling away from the fault. By the use of a ferrite type transformer coupler producing an output voltage, the direction of the transient fault pulse is determined by relating the polarity of the output voltage to the initial high voltage pulse which was applied.

5 Claims, 4 Drawing Sheets

METHOD OF LOCATING A FAULT IN AN ELECTRIC POWER CABLE

The present invention relates to a method of locating a fault in an electric power cable and more particularly to pinpointing the location of a fault between known locations such as manholes in a city's underground distribution system.

PRIOR ART

When locating a fault in a multiphase urban network which is normally underground, techniques such as reflectometry or time-delayed analysis are used. In such techniques the transmission line is normally several miles long and the equipment for locating faults would be located at a substation at the end of the line. Optimally the fault might be located with a tolerance of a few hundred feet. A typical fault so located has an insulation type defect which may be broken down by a high voltage of sufficient magnitude applied on one side of the fault to induce a transient fault pulse. Then this fault generated pulse is timed at the end of the cable and the fault location determined.

In other words it is known to apply high voltage to the cable to break down the insulation defect and induce a transient fault pulse to propagate through the cable to the end. For example, this is disclosed and claimed in a copending application Ser. No. 08/524,033, filed Sep. 6, 1995, entitled "System and Method for Locating Faults in Electric Power Cables" and includes two of the same inventors as the present application.

But as discussed above, it is still desired to accurately pinpoint the fault between two "manholes" or a manhole and a substation, and it is desired to do this in an inexpensive, reliable and robust manner.

Other locating techniques require highly repetitive high voltage discharges which place objectionable electromechanical stress on the cable and require conditioning which involves applying repeated pulses at a relatively high level of high voltage until the cumulative effect of these pulses reduces the breakdown voltage of the cable to some lower level of high voltage. This practice is disadvantageous because it causes the cable insulator to deteriorate.

OBJECTS AND SUMMARY OF THE INVENTION

It is therefore an object of the present invention to provide a method of locating a fault which has occurred in an electric power cable.

In accordance with the above invention, a method of locating a fault which has occurred in an electric power cable in relationship to one or more known locations along the cable is provided where the fault is caused by an insulation defect which may be broken down by a high voltage applied at one side of the fault to induce a transient fault pulse on the cable on both sides of the fault travelling away from the fault. The method comprises the steps of applying a high voltage of a predetermined polarity in the cable on one side of the fault having a sufficient magnitude to break down the insulation defect and induce the transient fault pulse; at two known locations on either side of said fault sensing the transient fault pulse caused by the fault; determining at each sensing location the pulse direction; and if the directions are opposite recognizing that the fault is between the two sensing locations.

DETAILED DESCRIPTION OF PREFERRED EMBODIMENTS

Figure 1:
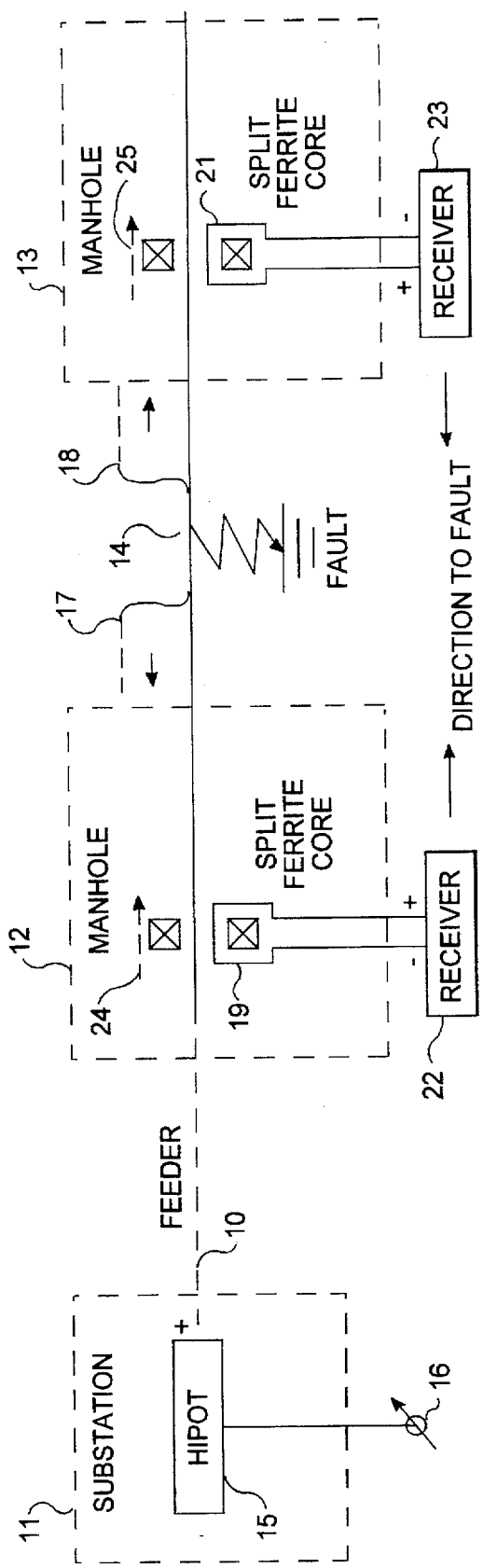
FIG. 1 is a system embodying the method of the present invention.

FIG. 1 illustrates a suburban or urban environment where, for example, a three-phase feeder cable 10 typically buried underground in a city street is fed from a substation 11. Downstream of the substation there are typical manholes 12 and 13. Such a cable is typically coaxial with a center conductor and an outer ground separated by insulation and includes a lead shielding to protect against moisture, chemicals, animals, and insects. At a point 14, labeled Fault, if the insulation breaks down because of a defect or accident, a short circuit will result causing the circuit breaker at the substation 11 to trip. Since feeder cable 10 may be several miles long, techniques discussed above may be utilized to determine within a few hundred feet the location of the fault. However, it is desirable to exactly pinpoint the fault between two manhole locations, or, as will be discussed later, between the substation and the manhole.

Thus FIG. 1 illustrates a test set up to exactly pinpoint the location of the fault 14 between manholes 12 and 13. At the substation 11 or at some other convenient place, a D.C. high voltage test set (commonly known as a Hipot) (which is commercially available, Hypotronics Model CF-60/1010/25-12C) provides a dc voltage of a polarity indicated nominally as plus with a variable magnitude control 16. As is known in the art, if this applied voltage is ramped up or increased to a sufficient magnitude, it will break down the insulation defect at 14, and induce a transient fault pulse which is then sensed and timed at the end of the transmission line.

What has been discovered in the present invention is that such a transient fault pulse will propagate in both directions, both upstream to the substation and downstream to the end of the line, as shown by the transient pulses 17 and 18. Thus, in other words, these transient pulses will both propagate in a direction leading away from the fault. This is believed to be caused by the line acting as a capacitor (at the fault) which discharges at break down.

To determine the direction of these transient fault pulses 17 and 18, in each of the manholes on both sides of the suspected fault 14, there are provided split ferrite cores 19 and 21 respectively which are mounted around the lead sheathing on the feeder cable 10. It should be noted that even though the lead nominally might electrically or magnetically shield the cable, the magnitude of the transient pulses 17 and 18 and/or existing currents in the lead sheathing are sufficient to induce an output voltage in the split ferrite core which is respectively received by the receivers 22 and 23. The receiver indicates whether the leading edge of the resulting or induced pulse is positive or negative and by comparison with the initial polarity of the pulse provided by the Hipot unit 15, the direction of the transient pulse 17 or 18 will be indicated. As shown in FIG. 1 where the directions are opposite, the fault will fall between the two sensing locations 12 and 13.

To insure that the split ferrite cores 19 and 21 are installed in relatively the same position, the reference directions 24 and 25 would be permanently inscribed on the split ferrite core inductive couplers. Such couplers may merely be split cylindrical ferrite with a winding such as is shown in Pelletier U.S. Pat. No. 4,325,022.

Figure 2:
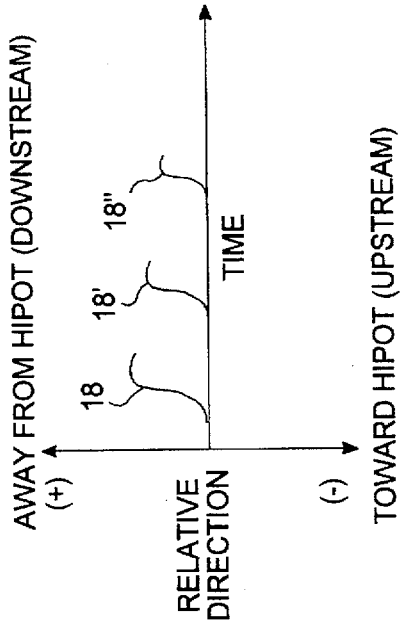
FIG. 2 is a timing diagram explaining the operation of FIG. 1.

FIG. 2 illustrates, for example, the transient fault pulse 18 in greater detail where there is initially a pulse of high amplitude and then additional pulses of lower amplitude 18' and 18". Thus the receiver inductively senses only the initial pulse to provide an output signal of a certain polarity. This polarity is indicative of whether the pulses 17 and 18 are traveling away from the Hipot (downstream) or towards the Hipot (upstream). Theoretically the polarity of the receivers' output signal or voltage indicating the direction of the fault pulses may be thought of as being determined by the "right hand rule" or as a corollary Lenz's law.

The right hand rule is defined as follows:

"For a current-carrying wire, the rule that if the fingers of the right hand are placed around the wire so that the thumb points in the direction of the current flow, the fingers will be pointing in the direction of the magnetic field produced by the wire".

Figure 3:
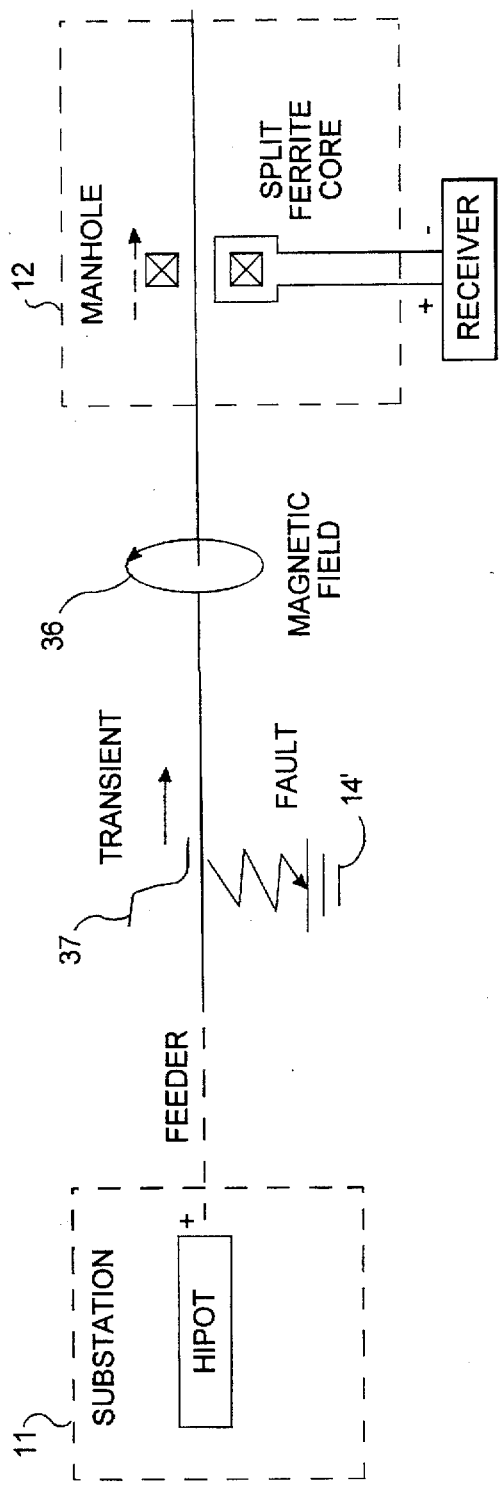
FIGS. 3 and 4 are additional block diagrams showing the operation of the method of the present invention in different context.
Figure 4:
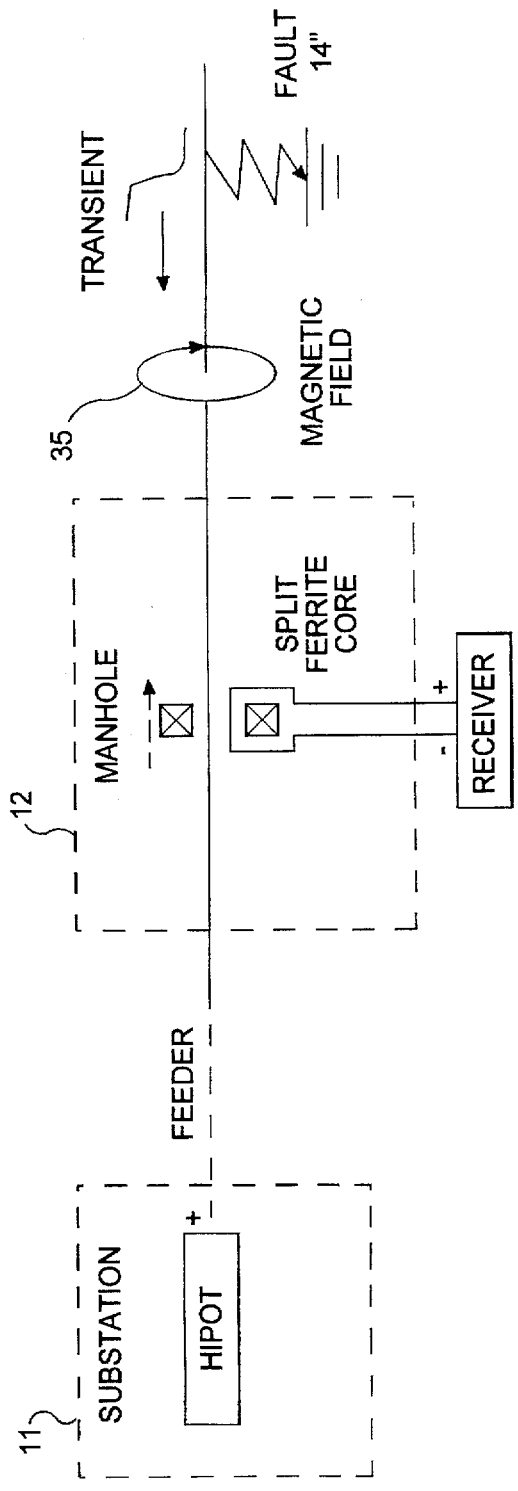

For the right hand rule, the magnetic field produced by pulses 17 and 18 may be thought of as going in opposite directions 35, 36 indicated briefly in FIGS. 3 and 4. Lenz's law is "the direction of an induced emf is such as to oppose the cause producing it".

Figure 5:
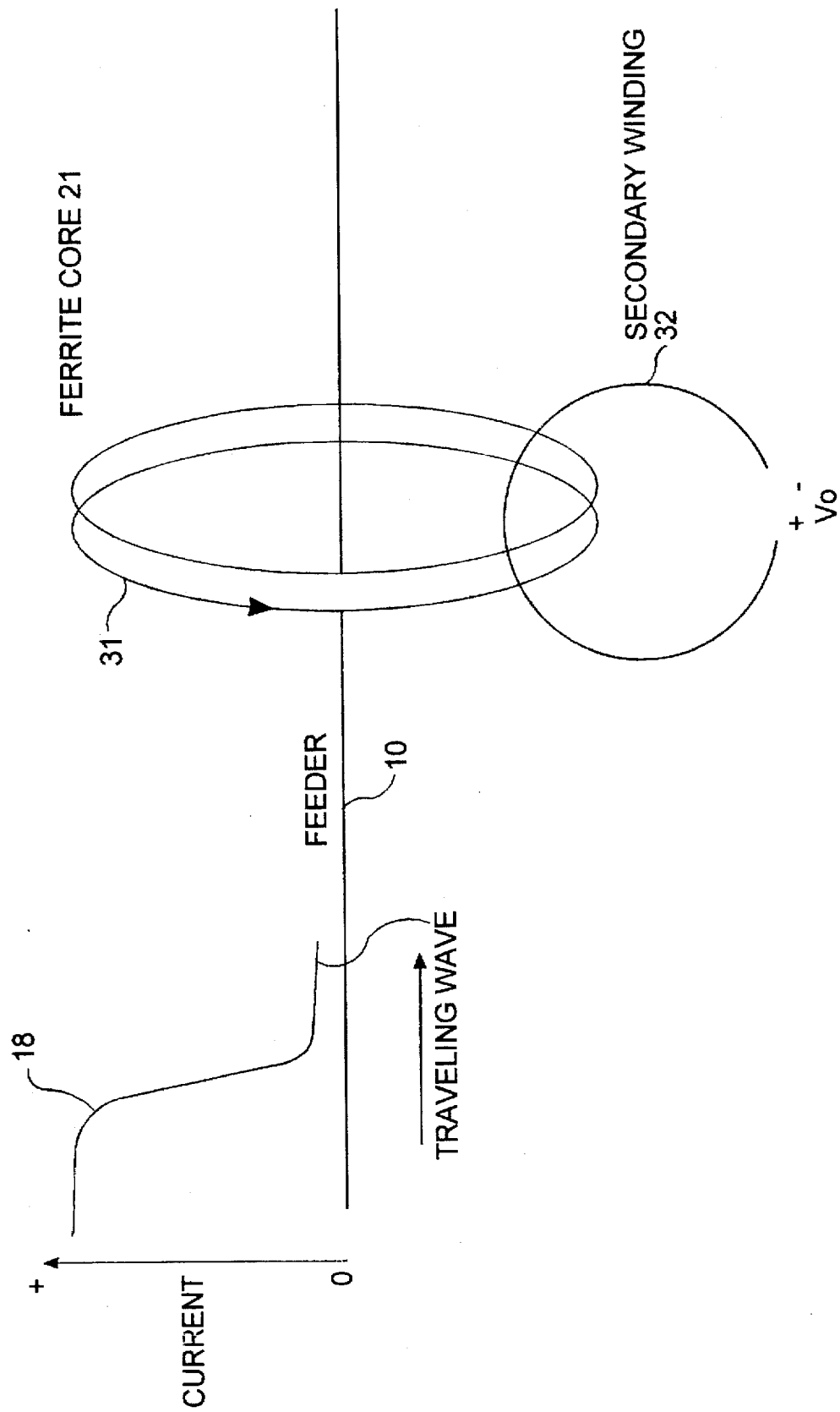
FIG. 5 is a timing diagram explaining the concept of the present invention.

This is illustrated in FIG. 5 where, for example, the traveling wave 18 passing through the ferrite core 21 provides a field indicated at 31. Then the secondary winding 32 in the ferrite core 21 provides the output voltage Vo.

Figure 6:
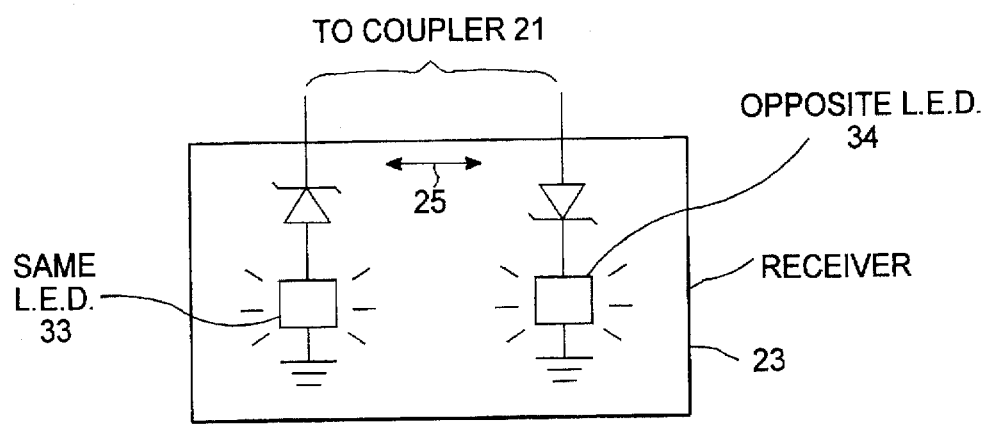
FIG. 6 is a block diagram showing in greater detail components of FIGS. 1, 3, and 4.

All of the foregoing from a practical standpoint is determined in the laboratory with use of a model setup where the reference directions 24 and 25 of each split ferrite core are inscribed as shown in FIG. 1. And, of course, the Hipot 15 polarity must always be kept the same. If not, then all indications on the receivers 22 and 23 are the opposite. A typical receiver 22, 23 is shown in FIG. 6 where the ferrite core coupler feeds a pair of light emitting diodes designated SAME LED 33 and Opposite LED 34. And by this is meant that the "SAME" LED will be illuminated when the transient fault pulse is traveling in the same direction as the reference 25 or the "Opposite LED" if the opposite direction.

FIG. 3 illustrates another variation of the invention where the fault 14' may occur between manhole 12 and the substation 11, and the resultant magnetic field 36 of the transient fault pulse 37 is indicated. Then FIG. 4 is the opposite situation where the fault 14" is downstream of both the manhole 12 and substation 11 and the transient fault pulse has a magnetic field 35 of opposite direction to field 36. Here once the pulse direction is known then the fault is either between the manhole (that is the sensing location) and the application point or past both of them, as indicated respectively in FIGS. 3 and 4.

Figure 7:
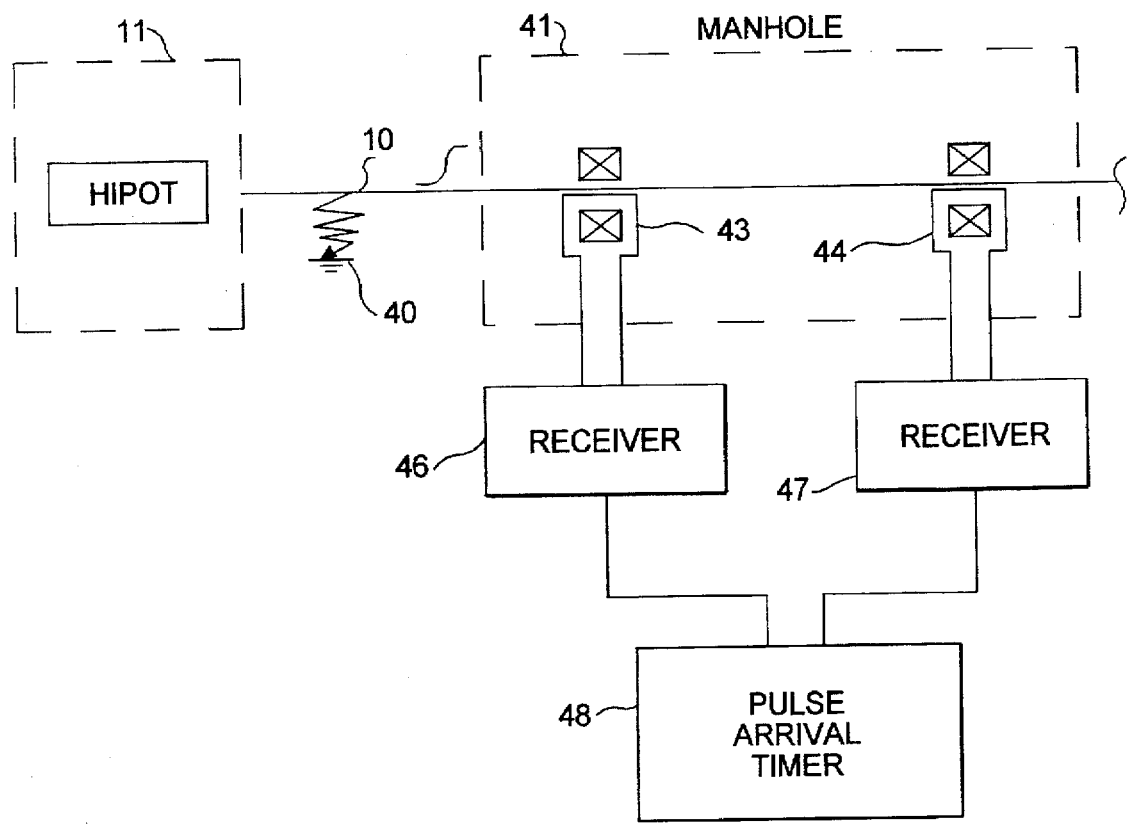
FIG. 7 is a block diagram of an alternative embodiment of the invention.

FIG. 7 illustrates an alternative embodiment where a fault 40 is shown on the feeder line 10 and only a single manhole 41 is used. Here determination of the direction of the fault does not necessarily depend on polarity. Rather a pair of ferrite core couplers 43 and 44 are used in the manhole with the same type of receivers 46 and 47. The coupler which receives the first transient fault pulse in time indicates that the direction is from that coupler to the other. And this is provided by pulse arrival timer 48. This technique with limited space in the manhole and very critical timing requirements may not be as effective as the above method.

The present invention has a number of advantages. For example, it does not require a great deal of labor. The existing substation staff to man the Hipot and a field crew which may be successively sent to, for example, manholes 12 and 13, as illustrated in FIG. 1. There is no necessity to have crews simultaneously in the two manholes. The present invention requires a few voltage applications rather than the hundreds or thousands of repetitive high voltage discharges of the prior technique ; this may place too much electromechanical stress on the cable. This prior technique also required conditioning as discussed above.

In the present invention the fault inducing voltage is ramped up by the Hipot 15 (there are no pulses) and is almost always less than the rated voltage of the cable. Also the magnitude of the resultant transient voltages is sufficiently high that extraneous noise is not a problem and the indications given by the, for example, light emitting diodes on the receivers are quite reliable. Furthermore because of the foregoing, the invention is not as sensitive to variations in grounding arrangements as other methods.

Thus a method of pinpointing the location of a fault in an electric cable has been provided.

What is claimed is:

1. A method of locating a fault which has occurred in an electric power cable in relationship to one or more known locations along the cable where the fault is caused by an insulation defect which may be broken down by a high voltage applied at one side of the fault to induce a transient fault pulse on the cable on both sides of the fault traveling away from the fault comprising the following steps:

after said fault has occurred applying a said high voltage of a predetermined polarity in the de-energized cable on one side of the fault having a sufficient magnitude to break down said insulation defect and induce said transient fault pulse;

at two known locations on either side of said fault sensing said transient fault pulse caused by said fault;

determining at each sensing location the pulse direction;

if the directions are opposite recognizing that the fault is between the two sensing locations.

2. A method of locating a fault which has occurred in an electric power cable in relationship to one or more known locations along the cable where the fault is caused by an insulation defect which may be broken down by a high voltage applied at one side of the fault to induce a transient fault pulse on the cable on both sides: of the fault traveling away from the fault comprising the following steps:

after said fault has occurred applying a said high voltage of a predetermined polarity in the de-energized cable on one side of the fault having a sufficient magnitude to break down said insulation defect and induce said transient fault pulse;

sensing at one known location on said cable either between the point of injection of said high voltage and said fault or after both said fault and said point of application on said cable said transient fault pulse;

determining the pulse direction;

and recognizing in view of said pulse direction that the fault is between the sensing location and the application point or past both the application point and the sensing location.

3. A method of locating a fault which has occurred in an electric power cable in relationship to one or more known locations along the cable where the fault is caused by an insulation defect which may be broken down by a high voltage applied at one side of the fault to induce a transient fault pulse on the cable on both sides of the fault traveling away from the fault comprising the following steps:

after said fault has occurred applying a said high voltage of a predetermined polarity in the de-energized cable on one side of the fault having a sufficient magnitude to break down said insulation defect and induce said transient fault pulse;

sensing at two locations on said cable either between said point of application of said high voltage and said fault or after both said fault and said point of application of said transient fault pulse;

determining said pulse direction by timing the relative arrival time of said fault pulse at said two locations; and recognizing in view of said pulse direction that the fault is between the sensing locations and the application point or past both the application point and the sensing locations.

4. A method as in claims 1 or 2 where said transient pulse is sensed by inductively coupling to said cable to provide an output voltage and where said pulse direction is determined by comparing said polarity of said applied high voltage with the polarity of said output voltage.

5. A method as in claim 1 where said breakdown voltage magnitude is less than the rated voltage of said cable and only a few applications of such voltage are used.

* * * * *